(12) United States Patent
Yu et al.

(10) Patent No.: US 11,075,184 B2
(45) Date of Patent: Jul. 27, 2021

(54) SEMICONDUCTOR PACKAGE AND METHOD OF FABRICATING SEMICONDUCTOR PACKAGE

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW); Chun-Hui Yu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/719,995

(22) Filed: Dec. 19, 2019

(65) Prior Publication Data

US 2020/0126940 A1    Apr. 23, 2020

Related U.S. Application Data

(63) Continuation of application No. 16/022,704, filed on Jun. 29, 2018, now Pat. No. 10,515,921, which is a (Continued)

(51) Int. Cl.
 *H01L 23/495* (2006.01)
 *H01L 23/00* (2006.01)
 (Continued)

(52) U.S. Cl.
 CPC .......... *H01L 24/24* (2013.01); *H01L 23/3114* (2013.01); *H01L 23/3128* (2013.01); *H01L 23/481* (2013.01); *H01L 23/5384* (2013.01); *H01L 23/5386* (2013.01); *H01L 24/19* (2013.01); *H01L 25/065* (2013.01); *H01L 25/0655* (2013.01); *H01L 2224/211* (2013.01); *H01L 2224/24137* (2013.01); *H01L 2224/73204* (2013.01); *H01L 2924/15311* (2013.01); *H01L 2924/181* (2013.01)

(58) Field of Classification Search
 CPC ............... H01L 23/3128; H01L 23/481; H01L 23/5384; H01L 23/5386; H01L 24/19; H01L 24/24; H01L 25/065; H01L 25/0655
 USPC ........................................................ 257/668
 See application file for complete search history.

(56) References Cited

U.S. PATENT DOCUMENTS 7,993,972 B2 * 8/2011 Lin ..................... H01L 23/3135
                                                    438/109
8,450,853 B2 * 5/2013 Uchiyama ............. H01L 21/565
                                                    257/773

(Continued)

*Primary Examiner* — Luan C Thai
(74) *Attorney, Agent, or Firm* — JCIPRNET

(57) ABSTRACT

A semiconductor package has at least one die, a first redistribution layer and a second redistribution layer. The first redistribution layer includes a first dual damascene redistribution pattern having a first via portion and a first routing portion. The second redistribution layer is disposed on the first redistribution layer and over the first die and electrically connected with the first redistribution layer and the first die. The second redistribution layer includes a second dual damascene redistribution pattern having a second via portion and a second routing portion. A location of the second via portion is aligned with a location of first via portion.

20 Claims, 11 Drawing Sheets

Related U.S. Application Data continuation-in-part of application No. 15/662,279, filed on Jul. 27, 2017, now Pat. No. 10,157,864.

(60) Provisional application No. 62/620,380, filed on Jan. 22, 2018.

(51) Int. Cl.
*H01L 23/48* (2006.01)
*H01L 23/31* (2006.01)
*H01L 25/065* (2006.01)
*H01L 23/538* (2006.01)

(56) References Cited

U.S. PATENT DOCUMENTS

| | | | |
|---|---|---|---|
| 9,842,798 B2 * | 12/2017 | Marimuthu | H01L 21/6835 |
| 9,875,949 B2 * | 1/2018 | Huang | H01L 23/5385 |
| 2010/0140759 A1 * | 6/2010 | Pagaila | H01L 21/565 |
| | | | 257/660 |
| 2018/0012774 A1 * | 1/2018 | Hu | H01L 21/6835 |

* cited by examiner

SEMICONDUCTOR PACKAGE AND METHOD OF FABRICATING SEMICONDUCTOR PACKAGE

CROSS-REFERENCE TO RELATED APPLICATION

This application is a continuation application of and claims the priority benefit of a prior application Ser. No. 16/022,704, filed on Jun. 29, 2018, which is a continuation-in-part application of and claims the priority benefit of a prior application Ser. No. 15/662,279, issued as U.S. Pat. No. 10,157,864, filed on Jul. 27, 2017. This application also claims the priority benefit of U.S. provisional application Ser. No. 62/620,380, filed on Jan. 22, 2018. The entirety of the above-mentioned patent applications is hereby incorporated by reference herein and made a part of this specification.

BACKGROUND

Packaging technologies involve encapsulation materials for encapsulating integrated circuits (ICs) and/or semiconductor devices and redistribution layers as the interface between the semiconductor devices and the packages. The formation of fin-pitch redistribution layers allows for fabricating high integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3D' is a schematic cross-sectional view of a semiconductor package structure having redistribution layers in accordance with some embodiments.

DETAILED DESCRIPTION

Figure 1A:
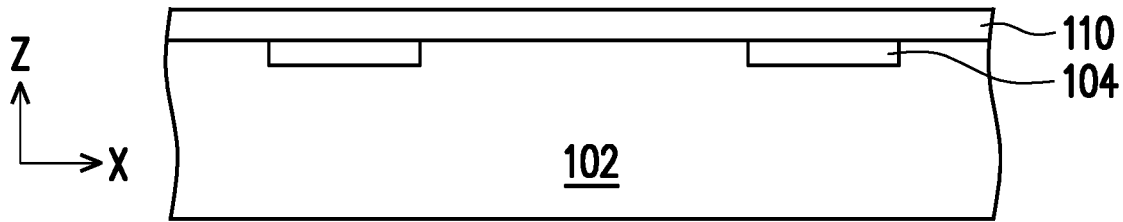
FIGS. 1A-1G schematically illustrate various stages of processes for forming a redistribution layer according to a method of fabricating a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3 DIC devices. The testing structures may include, for example, test pads formed in a redistribution layer or on a substrate that allows the testing of the 3D packaging or 3 DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1G schematically illustrate various stages of processes for forming a redistribution layer according to a method of fabricating a semiconductor package in accordance with some embodiments. Referring to FIG. 1A, a substrate 102 having a plurality of contacts 104 is provided. In some embodiments, a first dielectric layer 110 is formed over the substrate 102 and covering the contacts 104. In some embodiments, the substrate 102 is a semiconductor wafer having plural semiconductor chips therein. In certain embodiments, the substrate 102 is a reconstituted wafer including a plurality of dies molded in a molding compound. In some embodiments, the substrate 102 may be a monocrystalline semiconductor substrate such as a silicon substrate, a silicon-on-insulator (SOI) substrate or a germanium-on-insulator (GOI) substrate, for example. In accordance with the embodiments, the semiconductor substrate may include other conductive layers, doped regions or other semiconductor elements, such as transistors, diodes or the like. The embodiments are intended for illustration purposes but not intended to limit the scope of the present disclosure.

Referring to FIG. 1A, in some embodiments, the first dielectric layer 110 may be formed by a coating process such as spin-coating process, a lamination process or a deposition process including a chemical vapor deposition (CVD) process. In certain embodiments, the first dielectric layer 110 may be a photo-sensitive material layer. In some embodiments, a material of the first dielectric layer 110 may include polyimide, benzocyclobutene (BCB), polybenzooxazole (PBO), or any suitable photo-sensitive polymer materials or other photoresist materials. In certain embodiments, the first dielectric layer 110 may include an organic polymeric material layer. In alternative embodiments, the first dielectric layer 110 may include an inorganic dielectric material layer.

Figure 1B:
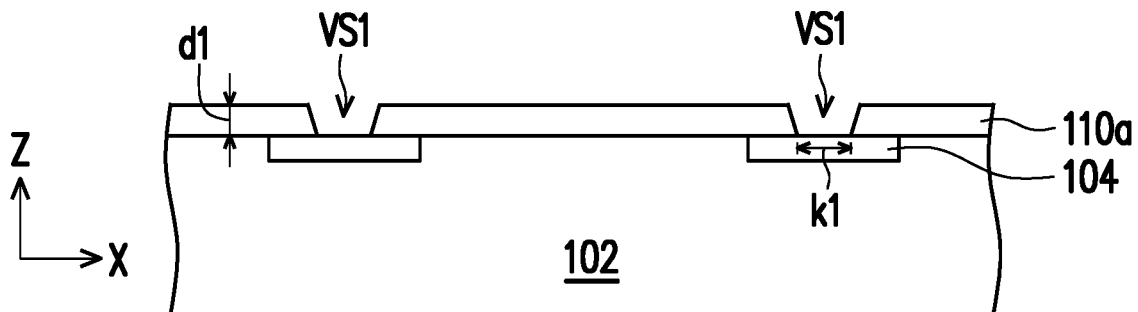

Referring to FIG. 1B, in some embodiments, the first dielectric layer 110 is patterned into a patterned first dielectric layer 110a with openings. In some embodiments, the openings of the patterned first dielectric layer 110a include via openings VS1, and some of the via openings VS1 expose the contacts 104 of the substrate 102. In certain embodiments, the first dielectric layer 110 is patterned by performing a photolithographic and etching process. In certain embodiments, the first dielectric layer 110 is partially removed through exposure and developing processes. In certain embodiments, the first dielectric layer 110 is partially removed or patterned by performing a laser ablation process.

Figure 1C:
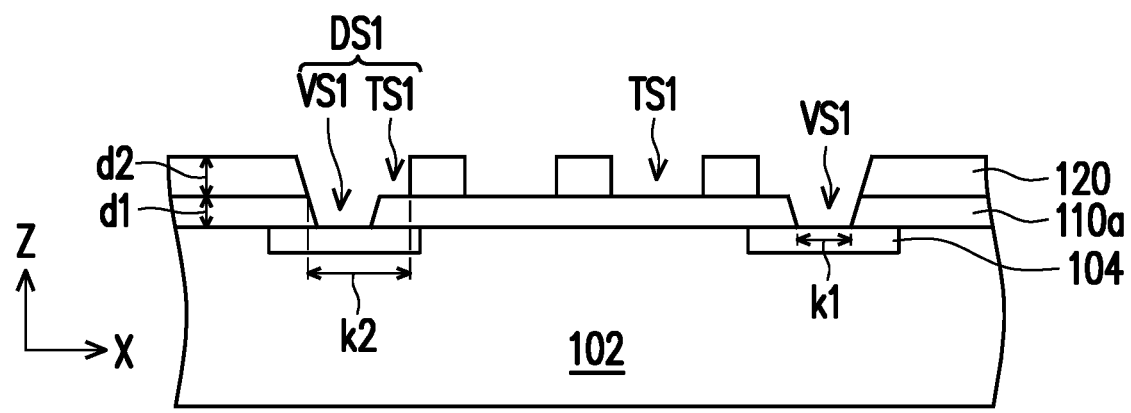

Referring to FIG. 1C, in some embodiments, a second dielectric layer 120 having a trench pattern is formed. In certain embodiments, the formation and patterning of the second dielectric layer 120 may be similar to the formation and patterning of the patterned first dielectric layer 110a and the details will not be repeated herein. In some embodiments, a material of the second dielectric layer 120 may include polyimide, BCB, PBO, or any suitable photo-sensitive polymer materials or other photoresist materials. In certain embodiments, second dielectric layer 120 may include an organic polymeric material layer. In alternative embodiments, second dielectric layer 120 may include an inorganic dielectric material layer. In some embodiments, a material of the second dielectric layer 120 is different from a material of the first dielectric layer 110, and the second dielectric layer 120 and the patterned first dielectric layer 110a constitute a stacked dielectric layer. In some embodiments, the first dielectric layer 110 and the second dielectric layer 120 are formed of a same material. In some embodiments, the second dielectric layer 120 with the trench pattern includes a plurality of trench openings TS1. In some embodiments, as seen in the cross-sectional view of FIG. 1C, portions of the trench openings TS1 that are not located directly above the via openings VS1 expose the underlying first dielectric layer 110a. In some embodiments, portions of the trench openings TS1 that are not located directly above the via openings VS1 may have be narrower (as routing lines) than other portions of the trench openings TS1 that are located directly above the via openings VS1. In some embodiments, the locations of some of the trench openings TS1 vertically align with the locations of some of the via openings VS1. In certain embodiments, the locations of some of the trench openings TS1 vertically overlay with the locations of some of the via openings VS1. In some embodiments, some of the trench openings TS1 are open to (i.e. joined with) the via openings VS1, and the joined trench and via openings constitute a dual damascene opening DS1. In some embodiments, some of the dual damascene openings DS1 expose the contacts 104 of the substrate 102.

In some embodiments, in FIG. 1B and FIG. 1C, the via opening VS1 is formed with a depth d1 and a bottom size k1 in the horizontal direction x (perpendicular to the thickness direction z). In some embodiments, the trench opening TS1 that is located directly above the via opening VS1 is formed with a depth d2 and a bottom size k2 in the horizontal direction x. In some embodiments, some of the trench openings TS1, the via openings VS1 and the dual damascene openings DS1 have slanted sidewalls. In some embodiments, some of the trench openings TS1, the via openings VS1 and the dual damascene openings DS1 have substantially vertical sidewalls. In some embodiments, the bottom size k1 of the via openings VS1 is smaller than the bottom size k2 of the trench openings TS1. In some embodiments, the bottom size k1 of the via opening VS1 is smaller than or about 10 microns. In some embodiments, the depth d1 is substantially equivalent to or smaller than the depth d2. In certain embodiments, the via openings VS1 are formed with substantially the same size and/or the same shape. In certain embodiments, the trench openings TS1 are formed in one or more shapes and in one or more sizes.

In alternative embodiments, it is likely to form a single dielectric layer having the via openings and the trench openings formed therein.

Figure 1D:
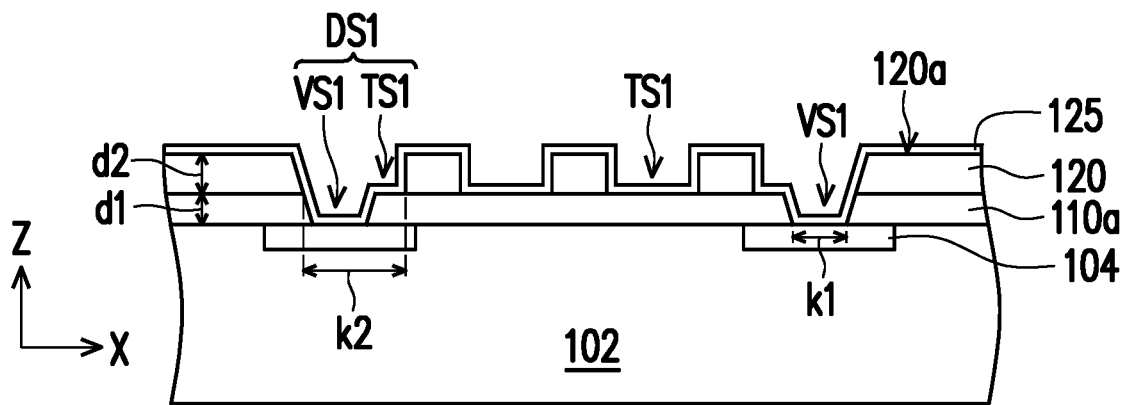

Referring to FIG. 1D, in some embodiments, a first seed metallic layer 125 is formed over the stack of the patterned first dielectric layer 110a and the second dielectric layer 120. In certain embodiments, the first seed metallic layer 125 is formed conformal to the profiles of the stack of the patterned first dielectric layer 110a and the second dielectric layer 120. That is, the first seed metallic layer 125 conformally covers the trench openings TS1 and the dual damascene openings DS1, evenly covering the sidewalls and bottom surfaces of the trench openings TS1 and the dual damascene openings DS1 and covering the top surface 120a of the second dielectric layer 120. In certain embodiments, the first seed metallic layer 125 is formed by chemical vapor deposition (CVD), physical vapor deposition (PVD), atomic layer deposition (ALD), high density plasma CVD (HDPCVD) or combinations thereof. In certain embodiments, the first seed metallic layer 125 is formed by sequentially depositing or sputtering a titanium layer and a copper layer (not shown). In one embodiment, the first seed metallic layer 125 covers and is in contact with the exposed surfaces of the contacts 104 (i.e. bottom surfaces of the via openings VS1). In certain embodiments, for the trench openings TS1 that are not located directly above the via openings VS1, the first seed metallic layer 125 is formed conformally covering the sidewalls and bottom surfaces of the trench openings TS1.

Figure 1E:
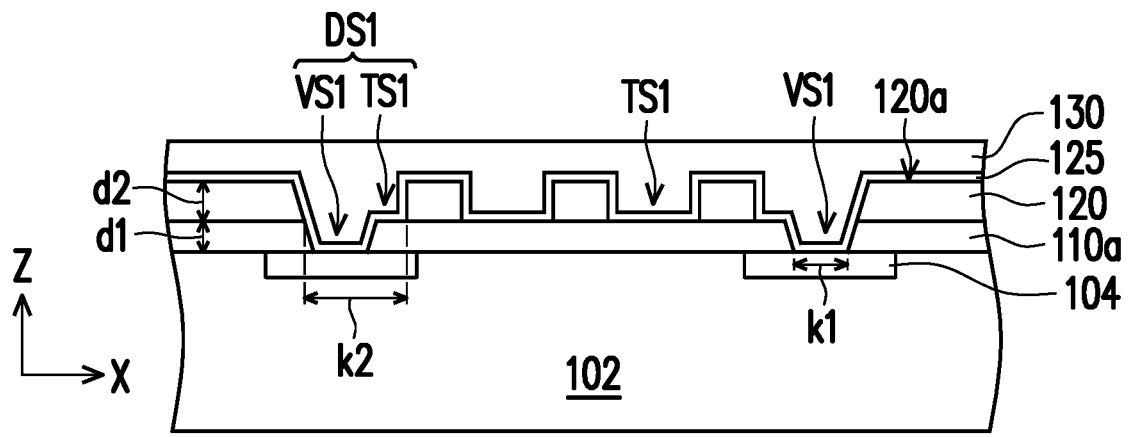

Referring to FIG. 1E, a first metal layer 130 is formed on the first seed metallic layer 125 and fills up the dual damascene openings DS1 and trench openings TS1 over the first dielectric layer 110a. In some embodiments, the formation of the first metal layer 130 includes forming a copper layer or a copper alloy layer (not shown) on the first seed metallic layer 125 by electroplating to fill the dual damascene openings DS1 and fill up the trench openings TS1 that are not located directly above the via openings VS1. In some embodiments, the first metal layer 130 is formed by a CVD process, an electrochemical plating (ECP) process or even a sputtering process. However, it is appreciated that the scope of this disclosure is not limited to the materials and descriptions disclosed above.

In some embodiments, as a conformal seed layer is formed before filling the metal layer into the openings, better adhesion is ensured for the later formed metal layer.

Figure 1F:
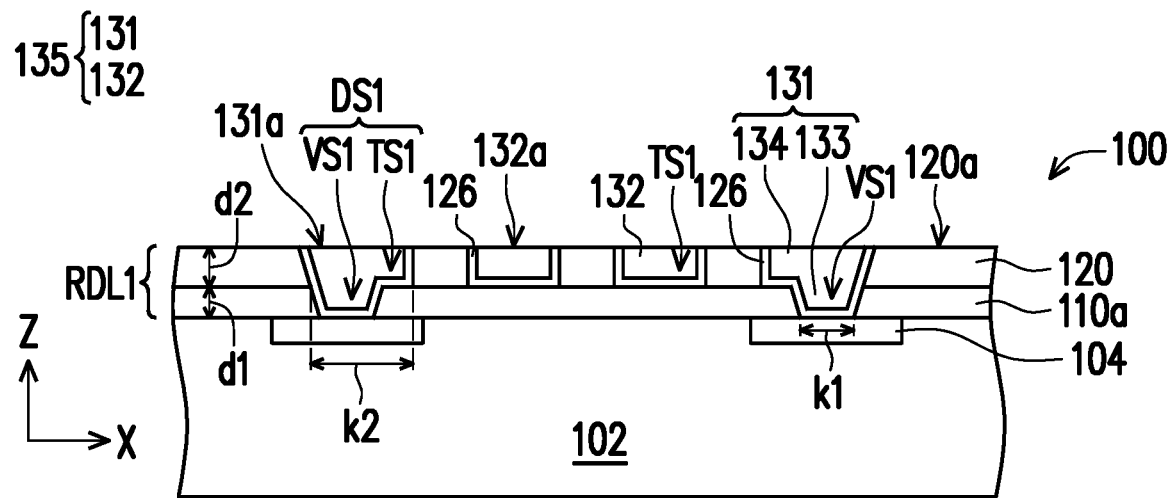

Referring to FIG. 1F, a planarization process is performed to partially remove the first metal layer 130 and the first seed metallic layer 125 above the top surface 120a of the second dielectric layer 120. In some embodiments, the first metal layer 130 along with the first seed metallic layer 125 above the top surface 120a of the second dielectric layer 120 are removed until the top surface 120a of the second dielectric layer 120 is exposed, so as to form first seed metallic patterns 126 and first metal redistribution patterns 135. In some embodiments, the first metal redistribution patterns 135 include routing redistribution patterns 132 filled within the trench openings TS1 and dual damascene redistribution patterns 131 filled within the damascene openings DS1. In some embodiments, the planarization process may include a chemical-mechanical polishing (CMP) process, a mechanical grinding process, a fly cutting process or an etching back process. In some embodiments, the planarization process may include a CMP process. In certain embodiments, after planarization, the formation of the first redistribution layer (RDL1) within the package structure 100 is completed.

In alternative embodiments, the substrate 102 is a wafer carrier or a glass carrier without the contacts formed therein, and the redistribution layer is temporarily formed on the carrier and will be detached from the carrier in later stages.

In some embodiments, after planarization, in FIG. 1F, the first seed metallic layer 125 and the first metal layer 130 remained within the damascene openings DS1 become the first seed metallic patterns 126 and dual damascene redistribution patterns 131, while the first seed metallic layer 125 and the first metal layer 130 remained within the trench openings TS1 become the first seed metallic patterns 126 and the routing redistribution patterns 132. In some embodiments, the first seed metallic pattern 126 is located within the damascene opening DS1, sandwiched between the dual damascene redistribution pattern 131 and the damascene openings DS1, and conformally covers the sidewalls and bottom surface of the dual damascene redistribution pattern 131 (also covering the sidewalls and bottom surface of the damascene openings DS1). In some embodiments, the first seed metallic pattern 126 located with the damascene opening DS1 is an integral piece uniformly and conformally covering the sidewalls and bottom surface of the dual damascene redistribution pattern 131 and the first seed metallic patterns 126 are obtained from the same layer (the first seed metallic layer 125).

In some embodiments, as shown in FIG. 1F, the dual damascene redistribution pattern 131 located with the damascene opening DS1 includes a via portion 133 (located within the via openings VS1) and a routing portion 134 (located within the trench openings TS1). The first seed metallic pattern 126 located with the damascene opening DS1 conformally covering the sidewalls of the routing portion 134 and sidewalls and bottom surface of the via portion 133 of the dual damascene redistribution pattern 131. In some embodiments, the top surface 120a of the second dielectric layer 120 is coplanar with and flush with the top surfaces 131a of the dual damascene redistribution patterns 131 and the top surfaces 132a of the routing redistribution patterns 132. In some embodiments, through the dual damascene process, the formed first redistribution layer RDL1 provides good planarity for the subsequently formed upper layers. Compared with semi-additive processes, the manufacturing processes described in the above embodiments fabricate the package structures with the metallic dual damascene patterns with lower costs and lower transmission loss, and such structures are applicable for high density applications or high frequency applications.

In some embodiments, the first redistribution layer RDL1 includes at least the first and second dielectric layers 110a, 120, the first seed metallic patterns 126 and the first metal redistribution patterns 135. The first redistribution layer RDL1 is electrically connected with the contacts 104 of the substrate 102. In alternative embodiments, the first redistribution layer RDL1 may include more than one dielectric patterns and various types of redistribution patterns including traces or connection lines. In exemplary embodiments, the layout of the redistribution patterns of the first redistribution layer RDL1 may form fan-in routings for wafer level packages or wafer level chip scale packages. In alternative embodiments, the layout of the redistribution patterns of the first redistribution layer RDL1 may form fan-out routings for wafer level packaging technology or for integrated fan-out (InFO) packages or package-on-package (PoP) structures.

In certain embodiments, through the formation of the damascene openings, filling capability of the metal layer into the dual damascene openings is improved and better adhesion between the dual damascene openings and the dual damascene redistribution patterns is provided through seed metallic patterns formed there-between. In addition, since the metal layer filled into the joined trench and via openings is an integral piece, a better mechanical strength may be achieved. Moreover, the conformal seed metallic layer assists in lowering the resistance, and the dual damascene redistribution patterns improve the reliability and electrical properties for the redistribution layer. In some embodiments, the redistribution layer that includes one or more dual damascene redistribution patterns and the seed metallic patterns covering the sidewalls and bottom surfaces of the dual damascene redistribution patterns is considered as a dual damascene containing redistribution layer.

Figure 1G:
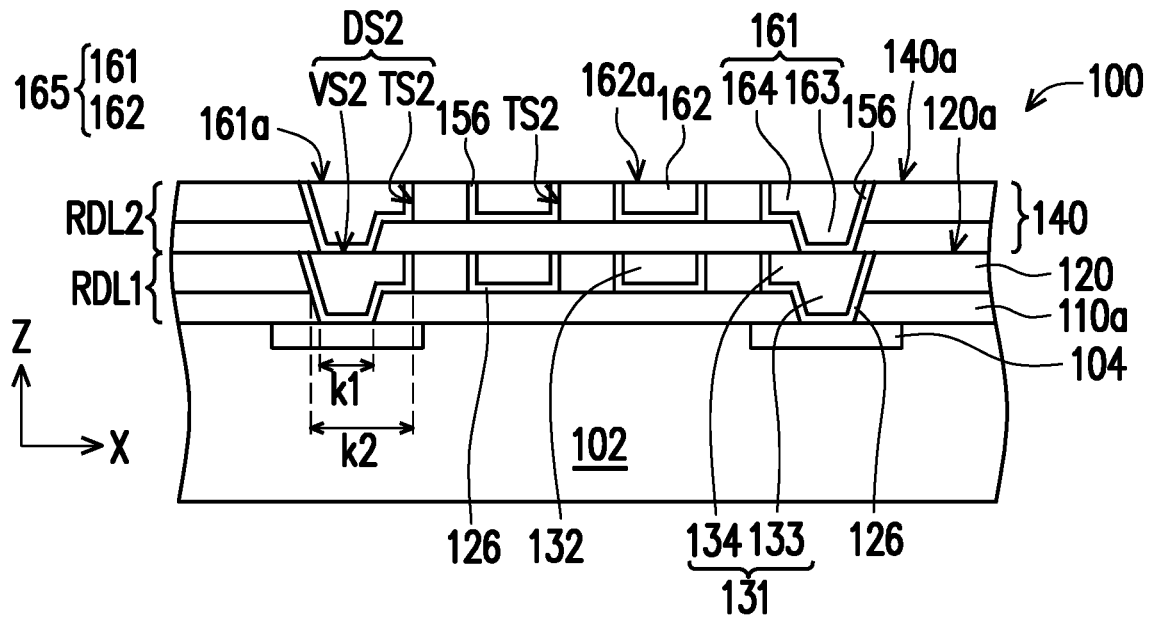

Referring to FIG. 1G, a second redistribution layer RDL2 is formed on the first redistribution layer RDL1 of the package structure 100. The formation of the second redistribution layer RDL2 may follow the same or substantially similar process steps as described in FIGS. 1A-1F and use the same or similar materials as described in the above embodiments. In some embodiments, the second redistribution layer RDL2 is disposed on the first redistribution layer RDL1 and is electrically connected with the first redistribution layer RDL1. In some embodiments, the second redistribution layer RDL2 includes at least the dielectric layer 140, second metal redistribution patterns 165 and second seed metallic patterns 156 sandwiched between the dielectric layer 140 and the second metal redistribution patterns 165. In some embodiments, the dielectric layer 140 may be a single dielectric layer or a stacked structure of two or more dielectric layers. In some embodiments, the second metal redistribution patterns 165 include dual damascene redistribution pattern 161 located within the damascene openings DS2 (joined via opening VS2 and trench opening TS2) and routing redistribution patterns 162 located within the trench openings TS2. In some embodiments, the second seed metallic pattern 156 sandwiched between the dual damascene redistribution pattern 161 and the damascene openings DS2 conformally covers the sidewalls and bottom surface of the damascene openings DS2. In certain embodiments, the second seed metallic pattern 156 sandwiched between the trench openings TS2 and the routing redistribution patterns 162 conformally covers the sidewalls and bottom surface of the trench openings TS2.

In some embodiments, as shown in FIG. 1G, the dual damascene redistribution pattern 161 located with the damascene opening DS2 includes a via portion 163 (located within the via openings VS2) and a routing portion 164 (located within the trench openings TS2). In some embodiments, the top surface 140a of the stacked dielectric layer 140 is coplanar with and flush with the top surfaces 161a of the dual damascene redistribution patterns 161 and the top surfaces 162a of the routing redistribution patterns 162.

In FIG. 1G, the locations of the via portions 163 of the dual damascene redistribution patterns 161 in the second redistribution layer RDL2 are vertically (along the thickness direction z) aligned with the locations of the via portions 133 of the dual damascene redistribution patterns 131 in the first redistribution layer RDL1. That is, the locations of the via openings VS2 or the via portions 163 vertically align with the locations of the via openings VS1 or the via portions 133. In certain embodiments, the locations of the via portions 163 vertically overlay with the locations of the via portions 133. In some embodiments, the dual damascene redistribution patterns 161 and the second seed metallic patterns 156 of the second redistribution layer RDL2 are disposed directly on the dual damascene redistribution patterns 131 of the first redistribution layer RDL1. In some embodiments, the second seed metallic patterns 156 below the dual damascene redistribution patterns 161 of the second redistribution layer RDL2 are in direct contact with the dual damascene redistribution patterns 131 of the first redistribution layer RDL1. In some embodiments, the via portions 163 of the second redistribution layer RDL2 are respectively stacked right above the via portions 133 of the first redistribution layer RDL1. In some embodiments, the bottom size of the via portions 163 in the horizontal direction x is smaller than or about 10 microns.

In some embodiments, the bottom size (in direction x) of the via opening VS2 is smaller than or at most about equivalent to the top size (in direction x) of the underlying routing portion 134 of the dual damascene redistribution patterns 131. In some embodiments, some of dual damascene redistribution patterns 161 (the via portions 163 and/or the routing portions 164) and some of the routing redistribution patterns 162 have slanted sidewalls. In some embodiments, some of dual damascene redistribution patterns 161 (the via portions 163 and/or the routing portions 164) and some of the routing redistribution patterns 162 have substantially vertical sidewalls. In some embodiments, the bottom size of the via openings VS1 is substantially the same as the bottom size of the via openings VS2. In some embodiments, the bottom size of the via openings VS1 is different from the bottom size of the via openings VS2. In some embodiments, via overlay and via stacking alignment among multiple redistribution layers are offered.

In FIG. 1G, more than one dual damascene redistribution patterns are shown for the first or second redistribution layer. In some embodiments, one or more via portions are included in the dual damascene redistribution pattern, and some of the routing portions may be connected with the dual damascene redistribution patterns. However, the layout of the redistribution layer or the arrangement of the dual damascene redistribution patterns is not limited by the embodiments described herein.

In certain embodiments, following the above process steps, at least one or plural redistribution layers are formed. It is understood that further manufacturing process steps or packaging process steps may be performed to complete the package structures, and the above described process steps are compatible with wafer level packaging technologies.

In certain embodiments, as the metal dual damascene structure has conformal metallic seed layer covering its sidewalls and bottom surface, better adhesion between the metal damascene structure with the surrounding dielectric material is achieved in the single- or multi-layered redistribution layers. The via portions of the dual damascene structures in different redistribution layers are directly stacked on each other or one another for the multi-layered redistribution layers.

Figure 2:
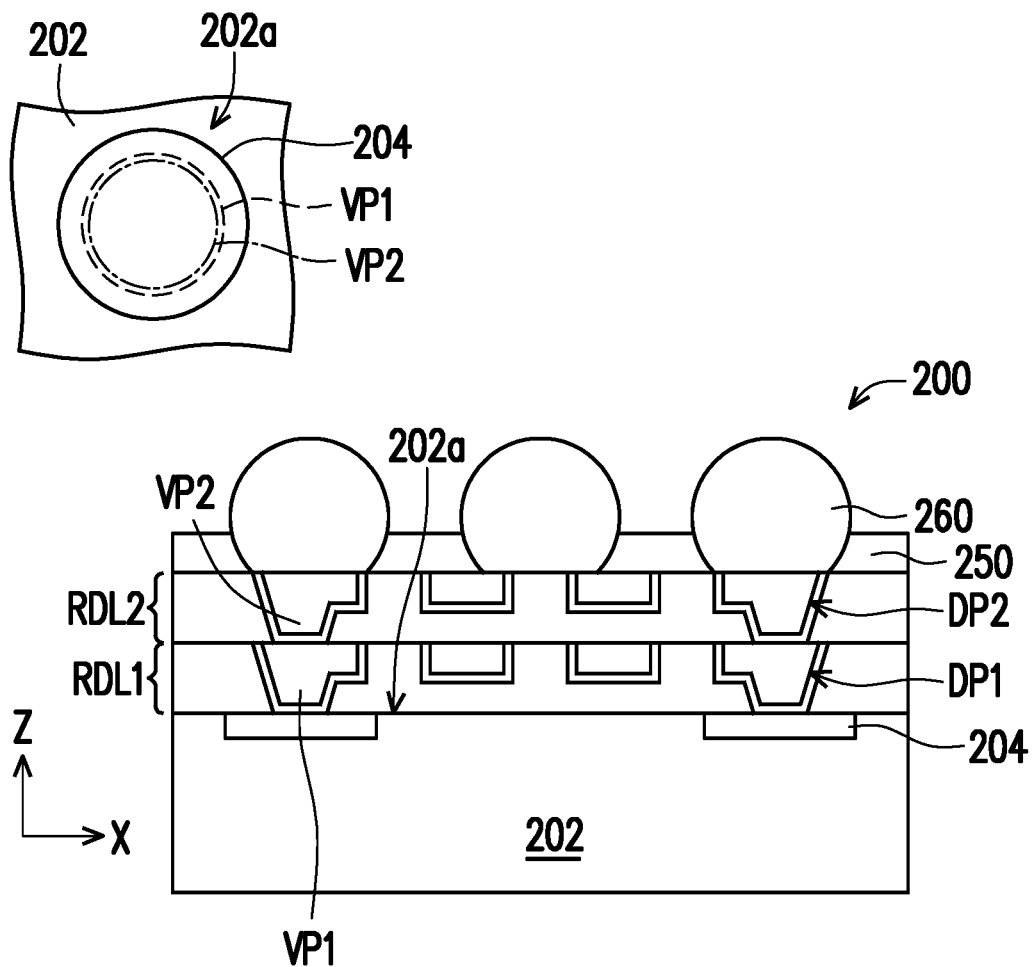
FIG. 2 schematically illustrates a semiconductor package having redistribution layers in accordance with some embodiments.

FIG. 2 schematically illustrates a semiconductor package having one or more redistribution layers in accordance with some embodiments. In some embodiments, the structure shown in FIG. 2 may be formed following the processes described in FIG. 1A-FIG. 1G, and after the formation of the second redistribution layer RDL2, a passivation layer is formed over the package structure 100 (FIG. 1G) by deposition, coating or lamination, and then patterned by lithographic processes or laser processing to formed openings exposing portions of the underlying second redistribution layer RDL2. Subsequently, a plurality of conductive balls is attached to the second redistribution layer RDL2, and the package structure 100 (FIG. 1G) may undergo a dicing process and the package structure 100 is cut into a plurality of packages 200. Referring to FIG. 2, the package 200 includes a die or chip 202, a first redistribution layer RDL1, a second redistribution layer RDL2 and conductive balls 260. In some embodiments, the first redistribution layer RDL1 is disposed on the chip 202 and is electrically and physically connected with contacts 204 of the chip 202. In some embodiments, the second redistribution layer RDL2 is disposed on the first redistribution layer RDL1 and is electrically connected with the first redistribution layer RDL1. In some embodiments, a passivation layer 250 is located on and covers the second redistribution layer RDL2, and the passivation layer 250 has openings exposing the underlying second redistribution layer RDL2. In some embodiments, some of the conductive balls 260 are located on the exposed second redistribution layer RDL2 within the openings, and are electrically and physically connected with the second redistribution layer RDL2. The formation of the passivation layer 250 is optional, and in other embodiments, the passivation layer 250 may be omitted.

In FIG. 2, the first redistribution layer RDL1 includes one or more dual damascene redistribution patterns DP1, and the second redistribution layer RDL2 includes one or more dual damascene redistribution patterns DP2. In some embodiments, the dual damascene redistribution patterns DP2 of the second redistribution layer RDL2 are stacked and disposed right above the dual damascene redistribution patterns DP1 of the first redistribution layer RDL1. In certain embodiments, the locations of via portions VP2 of the dual damascene redistribution patterns DP2 overlay with and vertically align with the locations of the via portions VP1 of the dual damascene redistribution patterns DP1. That is, the orthogonal projections of the via portions VP2 onto the plane of the substrate surface overlap with the orthogonal projections of the via portions VP1 onto the plane of the substrate surface. As seen the upper part of FIG. 2, if considering the bottom size of via opening VS1 is substantially equivalent to or larger than the bottom size of the via opening VS2, the orthogonal projection of the via portion VP1 (shown as dotted line) and the orthogonal projection of the via portion VP2 (shown as dashed line) on the substrate surface 202a overlap with each other and are arranged concentrically within span of the round contact 204.

In FIG. 2, the first and second redistribution layers RDL1, RDL2 are front-side redistribution layers formed on the active surface of the chip 202. The structure in FIG. 2 may be a wafer level chip scale package (WLCSP) structure, and the chip and the redistribution layers have substantially the same size scale.

Figure 3A:
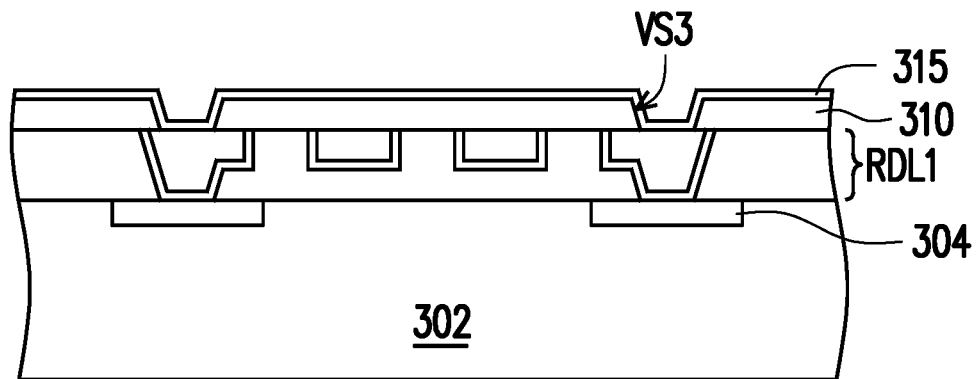
FIGS. 3A-3D schematically illustrate various stages of processes for forming another redistribution layer according to a method of fabricating a semiconductor package in accordance with some embodiments.

FIGS. 3A-3D schematically illustrate various stages of processes for forming another redistribution layer according to a method of fabricating a semiconductor package in accordance with some embodiments. Referring to FIG. 3A, a package structure having at least a first redistribution layer RDL1 formed on a substrate 302 is provided. In some embodiments, the first redistribution layer RDL1 is electrically connected with the contacts 304 of the substrate 302. In some embodiments, the package structure in FIG. 3A may be formed following the processes described in FIG. 1A-FIG. 1F. In some embodiments, a third dielectric layer 310 having via openings VS3 is formed on the first redistribution layer RDL1 and a third seed metallic layer 315 is formed over the third dielectric layer 310, conformally covering the third dielectric layer 310 and the via openings VS3.

Figure 3B:
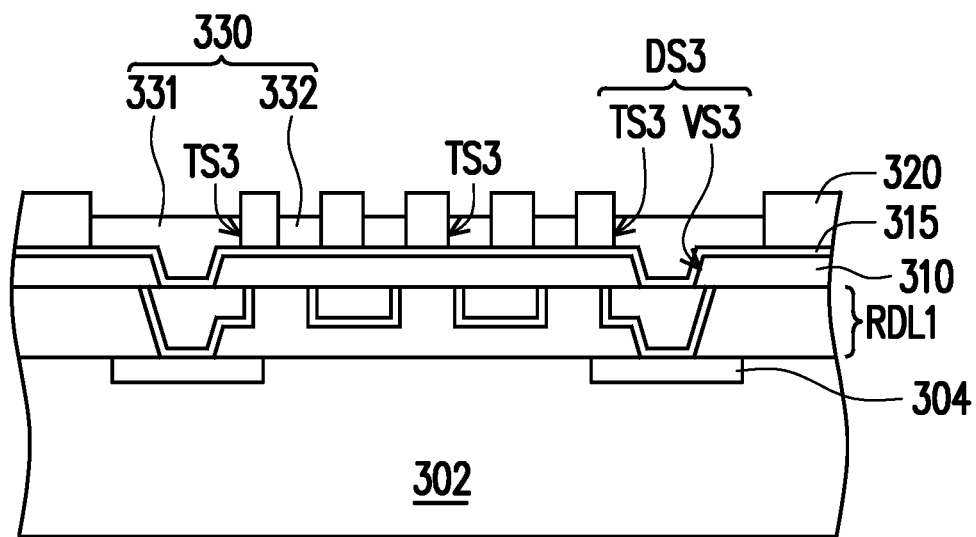

Later, as seen in FIG. 3B, in some embodiments, a photoresist pattern 320 defining the trench openings TS3 is formed on the third seed metallic layer 315. Some of the trench openings TS3 are joined with the via openings VS3 to form openings DS3. In some embodiments, the photoresist pattern 320 is formed by forming a photoresist layer (not shown) by lamination or spin coating and then patterned by lithographic processes or a laser process. In certain embodiments, a third metal layer 330 is formed on the third seed metallic layer 315, including the routing redistribution patterns 332 filling in the trench openings TS3 and the redistribution patterns 331 filling in the openings DS3. In some embodiments, the formation of the third metal layer 330 includes forming a copper layer or a copper alloy layer (not shown) on the seed metallic layer 315 by electroplating to fill the openings DS3 and fill up the trench openings TS3. In some embodiments, the third metal layer 330 is formed by a CVD process, an electrochemical plating (ECP) process or even a sputtering process. However, it is appreciated that the scope of this disclosure is not limited to the materials and descriptions disclosed above.

Figure 3C:
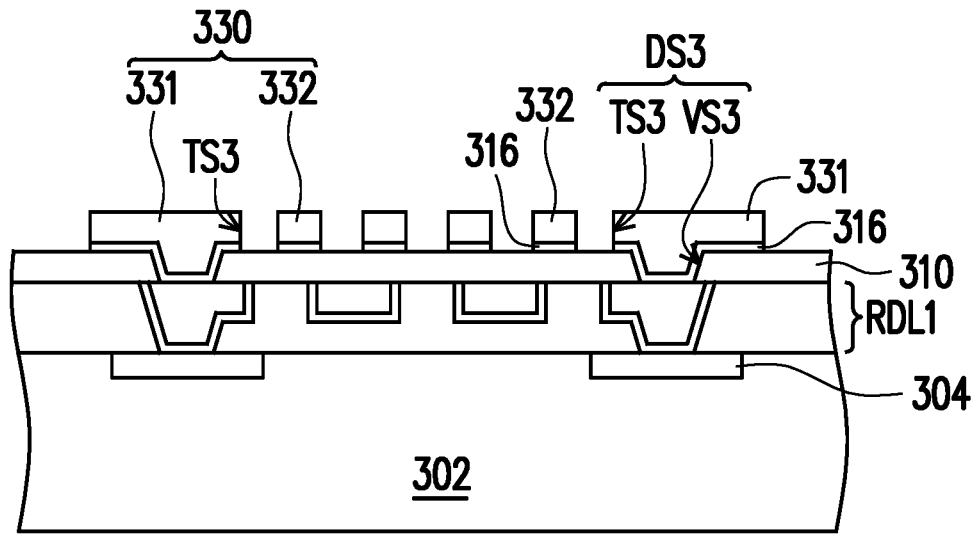

In some embodiments, in FIG. 3B and FIG. 3C, the photoresist pattern 320 is removed. In some embodiments, during the removal of the photoresist pattern 320, the third seed metallic layer 315 under the photoresist pattern 320 is removed along with the photoresist pattern 320, so as to form third seed metallic patterns 316 under the routing redistribution patterns 332 and the redistribution patterns 331. In alternative embodiments, the photoresist pattern 320 is removed by a stripping process and later the third seed metallic layer 315 is partially removed by an etching process. Referring to FIG. 3C, the third seed metallic patterns 316 is sandwiched between the third dielectric layer 310 and the bottom surfaces of the routing redistribution patterns 332 and the redistribution patterns 331. In some embodiments, the third seed metallic pattern 316 covers a bottom surface of the routing portion and covers sidewalls and a bottom surface of the via portion of the dual damascene redistribution pattern 331. That is, the third seed metallic patterns 316 do not cover the side surfaces of the routing redistribution patterns 332 and the redistribution patterns 331.

Figure 3D:
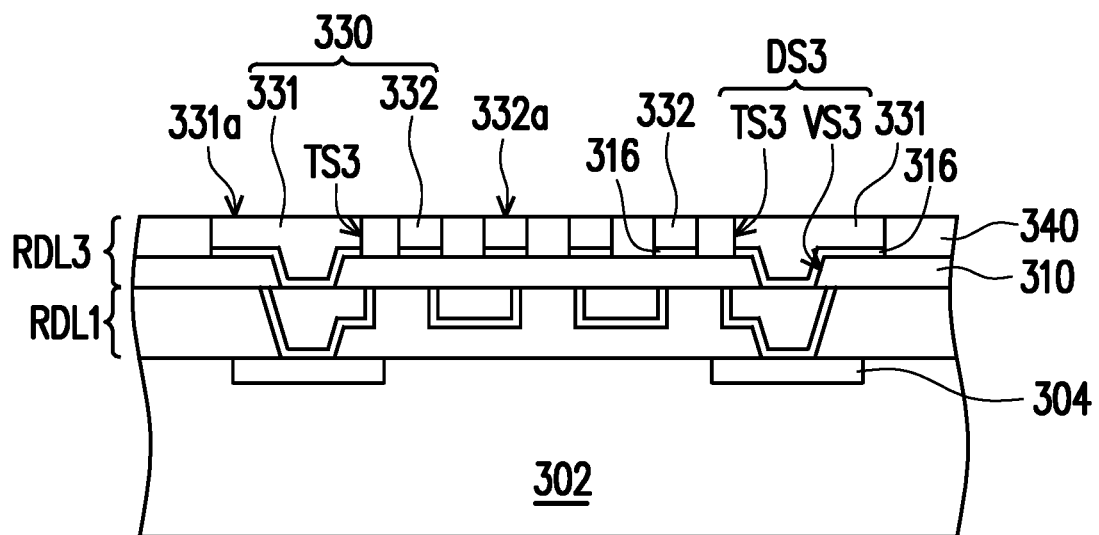
Figure 3D:
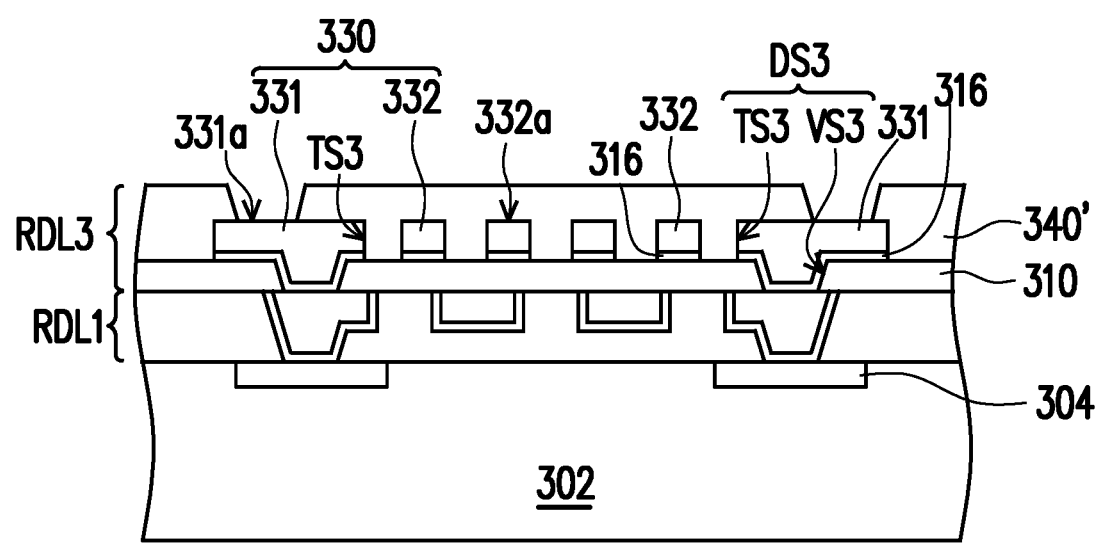

In some embodiments, in FIG. 3D, a fourth dielectric layer 340 is formed on the first redistribution layer RDL1. In some embodiments, the fourth dielectric layer 340 may be formed by lamination or coating to cover the routing redistribution patterns 332 and the redistribution patterns 331 and then partially removed or etched to expose the top surfaces 331a, 332a of the redistribution patterns 331 and the routing redistribution patterns 332. The formation of the third redistribution layer RDL3 on the first redistribution layer RDL1 is completed.

FIG. 3D' is a schematic cross-sectional view of a semiconductor package structure having redistribution layers in accordance with some embodiments. In FIG. 3D', the fourth dielectric layer 340' covers the routing redistribution patterns 332 but exposes portions of the redistribution patterns 331. In some embodiments, the fourth dielectric layer 340' may be formed by lamination or coating to fully cover the routing redistribution patterns 332 and the redistribution patterns 331 and then partially removed or etched to expose the top surfaces 331a of the portions of the redistribution patterns 331.

In some embodiments, the third redistribution layer RDL3 may be an ultra-high density redistribution layer having a small size of lines and spaces (L/S). In certain embodiments, the third redistribution layer RDL3 has the L/S size of about or smaller than 2 microns/2 microns. In exemplary embodiments, the third redistribution layer RDL3 is formed by semi-additive processes, having the L/S size smaller than that of the dual damascene containing redistribution layer (e.g. the first or second redistribution layer RDL1/RDL2). In some embodiments, the third redistribution layer RDL3 is formed on one or more dual damascene containing redistribution layers, and such stacked redistribution structures may be considered as a hybrid type redistribution structure.

Figure 4:
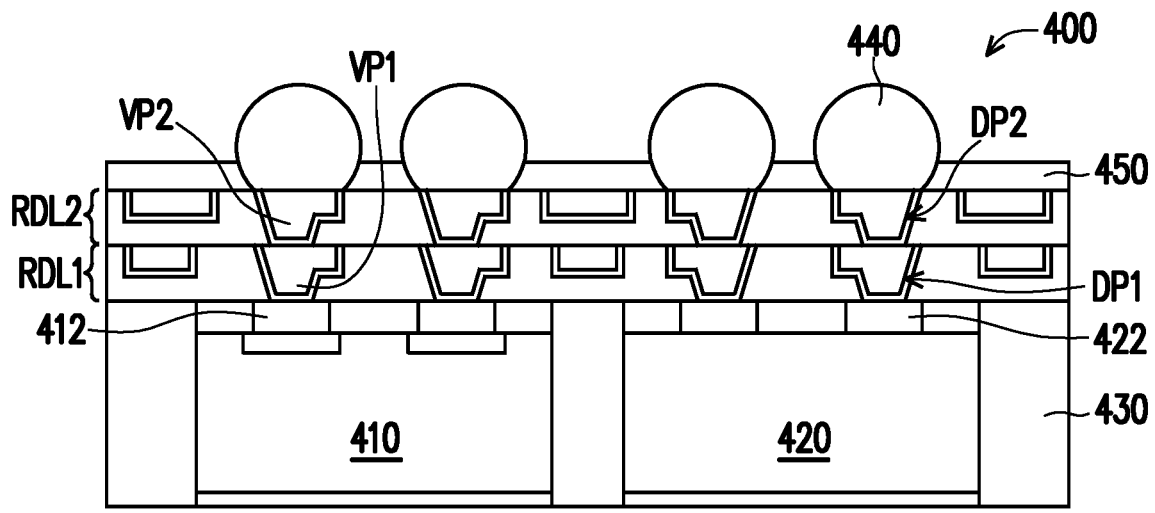
FIG. 4 schematically illustrates a semiconductor package having redistribution layers in accordance with some embodiments.

FIG. 4 schematically illustrates a semiconductor package having redistribution layers in accordance with some embodiments. Referring to FIG. 4, the integrated fan-out (InFO) package 400 includes a first die 410 and a second die 420 arranged side by side, and encapsulated within a molding compound 430. In some embodiments, at least a first redistribution layer RDL1 and a second redistribution layer RDL2 are located on the molding compound 430 and over the first die 410 and the second die 420. In addition, a plurality of conductive elements 440 are located on and connected to the second redistribution layer RDL2. In FIG. 4, the first redistribution layer RDL1 includes one or more dual damascene redistribution patterns DP1, and the second redistribution layer RDL2 includes one or more dual damascene redistribution patterns DP2. The formation of the second redistribution layer RDL2 is similar to the formation of the first redistribution layer RDL1 as described in FIG. 1A-FIG. 1F. In some embodiments, the dual damascene redistribution patterns DP2 of the second redistribution layer RDL2 are stacked and disposed right above the dual damascene redistribution patterns DP1 of the first redistribution layer RDL1. In certain embodiments, the orthogonal projections of the via portions VP2 onto the plane of the die surface fully overlap with the orthogonal projections of the via portions VP1 onto the same plane.

In some embodiments, the first redistribution layer RDL1 is electrically connected with the first die 410 and the second die 420, and the second redistribution layer RDL2 is also electrically connected with the first die 410 and the second die 420 through the first redistribution layer RDL1. Some of the dual damascene redistribution patterns DP1 of the first redistribution layer RDL1 are directly connected with first contacts 412 of the first die 410 and the second contacts 422 of the second die 420. In certain embodiments, the first die 410 includes a system-on-a-chip (SoC) die or an application specific integrated circuit (ASIC) chip. In certain embodiments, the second die 420 includes a memory chip or a high bandwidth memory chip. In FIG. 4, the first and second redistribution layers RDL1, RDL2 are front-side redistribution layers. In some embodiments, a passivation layer 450 is located on and covers the second redistribution layer RDL2 with openings exposing the underlying second redistribution layer RDL2. In some embodiments, conductive balls 260 are located on the exposed second redistribution layer RDL2 within the openings, and are electrically and physically connected with the second redistribution layer RDL2. In some embodiments, the conductive elements 440 are bumps, controlled collapse chip connection (C4) bumps or ball grid array (BGA) balls. The formation of the passivation layer 450 is optional, and in other embodiments, the passivation layer 450 may be omitted.

Figure 5:
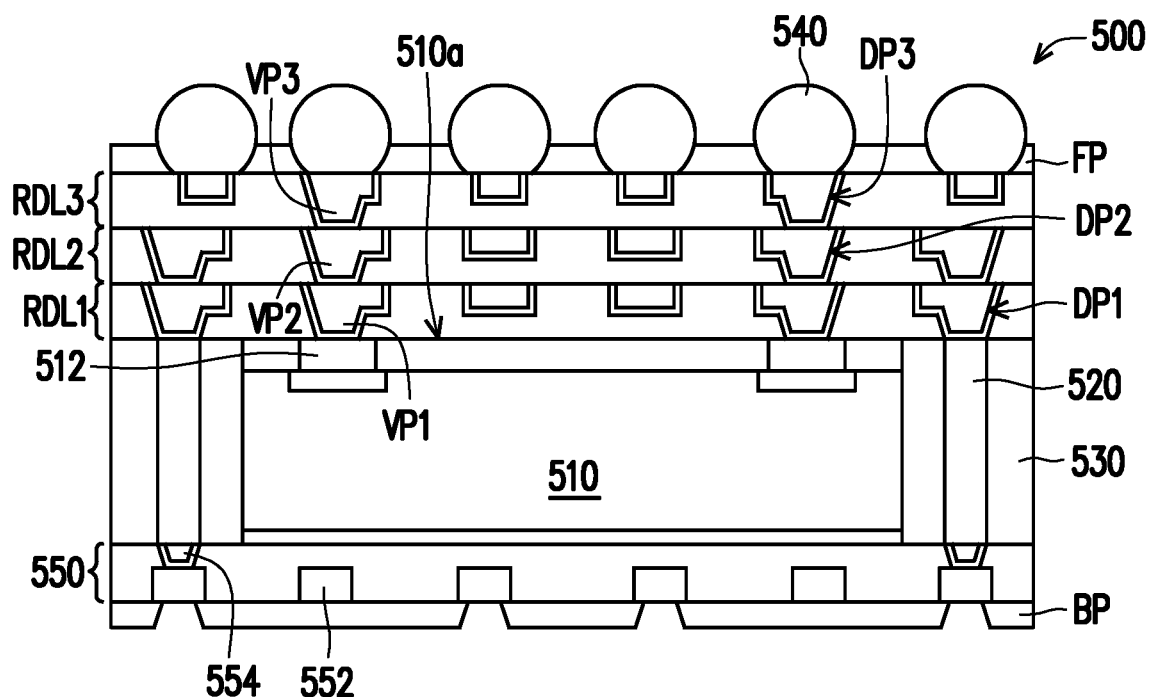
FIG. 5 schematically illustrates a semiconductor package having redistribution layers in accordance with some embodiments.

FIG. 5 schematically illustrates a semiconductor package having various redistribution layers in accordance with some embodiments. Referring to FIG. 5, the integrated fan-out (InFO) package 500 includes at least one die 510 and more than one through interlayer vias (TIVs) 520 encapsulated within a molding compound 530. In some embodiments, at least a first redistribution layer RDL1, a second redistribution layer RDL2 and a third redistribution layer RDL3 are sequentially stacked and located on the molding compound 530 and over the die 510 and the TIVs 520. In addition, a plurality of conductive elements 540 are located on and connected to the third redistribution layer RDL3. In some embodiments, the first and second redistribution layers RDL1, RDL2 may be formed following the processes as described in FIGS. 1A-1G. The formation of the third redistribution layer RDL3 is similar to the formation of the third redistribution layer RDL3 following the processes as described in FIGS. 3A-3D. In FIG. 5, the first, second and third redistribution layers RDL1, RDL2, RDL3 respectively include one or more dual damascene redistribution patterns DP1, DP2, DP3. In some embodiments, the dual damascene redistribution patterns DP3 of the third redistribution layer RDL3 are correspondingly stacked and disposed right above the dual damascene redistribution patterns DP2 of the second redistribution layer RDL2, while the dual damascene redistribution patterns DP2 of the second redistribution layer RDL2 are correspondingly stacked and disposed right above the dual damascene redistribution patterns DP1 of the first redistribution layer RDL1. In certain embodiments, the orthogonal projections of the via portions VP1, VP2, VP3 of the corresponding dual damascene redistribution patterns DP1, DP2, DP3 on the same plane (die top surface 510a) fully overlap with one another. In some embodiments, a front passivation layer FP covers the third redistribution layer RDL3 with openings exposing portions of the underlying third redistribution layer RDL3. The formation of the passivation layer FP is optional, and in other embodiments, the passivation layer FP may be omitted. In some embodiments, some of the conductive elements 540 are located on the exposed third redistribution layer RDL3 within the openings, and are electrically and physically connected with the third redistribution layer RDL3. In some embodiments, the conductive elements 540 are bumps, controlled collapse chip connection (C4) bumps or ball grid array (BGA) balls.

In some embodiments, in FIG. 5, the first redistribution layer RDL1 is electrically connected with the die 510, and the second and third redistribution layers RDL2, RDL3 are electrically connected with the die 510 through the first redistribution layer RDL1. Some of the dual damascene redistribution patterns DP1 of the first redistribution layer RDL1 are directly connected with contacts 512 of the die 510 and the TIVs 520 respectively. In certain embodiments, the die 510 includes an ASIC chip, an analog chip, a sensor chip, a wireless and radio frequency chip, a voltage regulator chip or a memory chip. In some embodiments, the package 500 further includes a backside redistribution structure 550 having routing lines 552 and through vias 554 electrically connected with the TIVs 520. In some embodiments, a back passivation layer BP is located over and covers the backside redistribution structure 550, and the back passivation layer BP has openings exposing portions of the routing lines 552 and through vias 554. Such back passivation layer BP may be formed as an option, and in other embodiments, the passivation layer BP may be omitted. In certain embodiments, the backside redistribution structure 550 facilitates further connection with another die or sub-package to form a package-on-package (PoP) structure.

In FIG. 5, the first, second and third redistribution layers RDL1-3 are front-side redistribution layers and are electrically connected with the die 510 and the TIVs 520. In some embodiments, routing redistribution patterns are also formed within the hybrid structure of the front-side redistribution layers, and positions of the routing redistribution patterns in different redistributions layers are not necessarily vertically aligned, depending on the layout design of the products. In exemplary embodiments, the third redistribution layer RDL3 has the L/S size smaller than that of the dual damascene containing redistribution layer (e.g. the first or second redistribution layer RDL1/RDL2). As the first and second redistribution layers RDL1, RDL2 provide good planarity for the subsequently formed high density third redistribution layer RDL3, the hybrid-type front-side redistribution layers offer good reliability and electrical properties for electrical connection.

Figure 6:
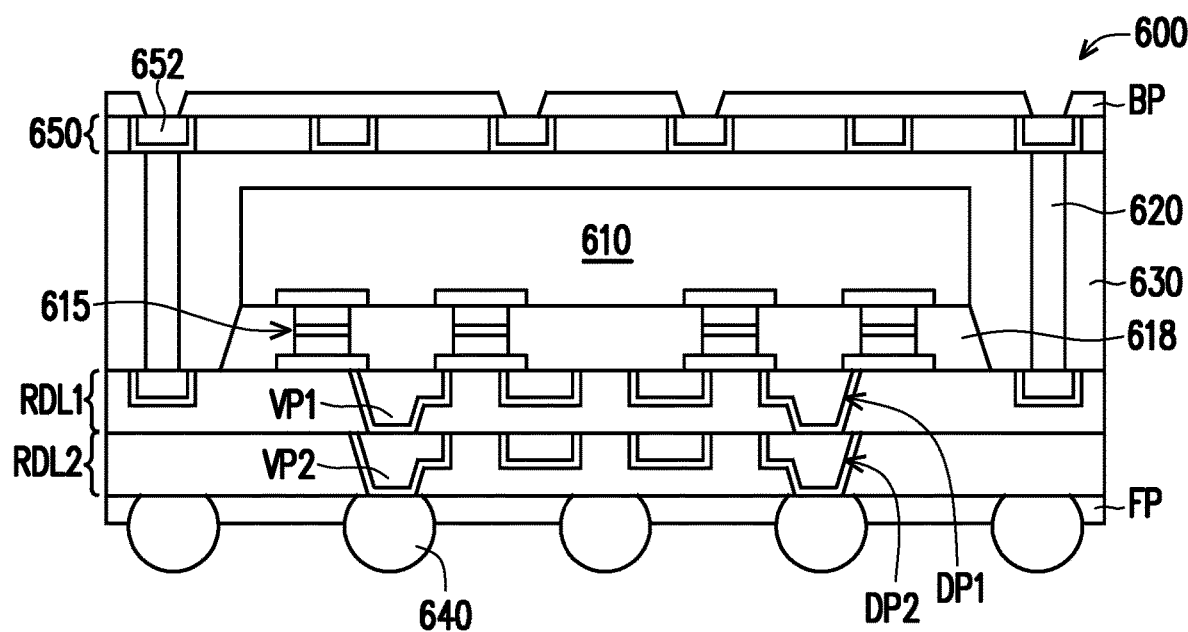
FIG. 6 schematically illustrates a semiconductor package having redistribution layers in accordance with some embodiments.

FIG. 6 schematically illustrates a semiconductor package having redistribution layers in accordance with some embodiments. Referring to FIG. 6, the fan-out package 600 includes at least one die 610 and more than one through interlayer vias (TIVs) 620 encapsulated within a molding compound 630. In some embodiments, the formation of the package 600 may follow redistribution layer first (RDL-first) processes, including forming at least a first redistribution layer RDL1 and a second redistribution layer RDL2 on a carrier before the placement of the die 610. In some embodiments, the first redistribution layer RDL1 and the second redistribution layer RDL2 are located below the molding compound 630 (located on the bottom surface of the molding compound 630), and under the die 610 and the TIVs 620. The first redistribution layer RDL1 is electrically connected with the TIVs 620 and electrically connected with a backside redistribution structure 650 through routing line 652 and the TIVs 620. In addition, a plurality of conductive elements 640 are located on and connected to the second redistribution layer RDL2. In some embodiments, both or at least one of the first and second redistribution layers RDL1, RDL2 may be formed following the processes as described in FIGS. 1A-1F. In some embodiments, at most one of the first and second redistribution layers RDL1, RDL2 is formed following the processes as described in FIGS. 3A-3D. In FIG. 6, the first and second redistribution layers RDL1, RDL2 respectively include one or more dual damascene redistribution patterns DP1, DP2. In some embodiments, the dual damascene redistribution patterns DP2 of the second redistribution layer RDL2 are correspondingly stacked and disposed right above the dual damascene redistribution patterns DP1 of the first redistribution layer RDL1. In certain embodiments, the orthogonal projections of the via portions VP1, VP2 of the corresponding dual damascene redistribution patterns DP1, DP2 on the same plane fully overlap with each other. That is, the first and second redistribution layers RDL1, RDL2 are electrically connected with each other.

In some embodiments, in FIG. 6, the first redistribution layer RDL1 is electrically connected with the die 610 through the bumps 615 located between the die 610 and the first redistribution layer RDL1, and the second redistribution layer RDL2 is electrically connected with the conductive elements 640. In some embodiments, a front passivation layer FP covers the second redistribution layer RDL2 with openings exposing portions of the second redistribution layer RDL2. The formation of the front passivation layer FP is optional, and in other embodiments, the passivation layer FP may be omitted. In some embodiments, the bumps 615 are micro-bumps, and an underfill 618 is further included between the die 610 and the first redistribution layer RDL1 and among the bumps 615. In some embodiments, some of the conductive elements 640 are located on the exposed second redistribution layer RDL2 within the openings of the front passivation layer FP, and are electrically and physically connected with the second redistribution layer RDL2. In some embodiments, the conductive elements 640 are controlled collapse chip connection (C4) bumps or ball grid array (BGA) balls. Some of the dual damascene redistribution patterns DP2 of the second redistribution layer RDL2 are directly connected with the conductive elements 640. In some embodiments, the backside redistribution structure 650 facilitates further connection with another die or sub-package to form a package-on-package (PoP) structure. In some embodiments, a back passivation layer BP is located over and covers the backside redistribution structure 650, and the back passivation layer BP has openings exposing portions of the routing lines 652. Such back passivation layer BP may be formed as an option, and in other embodiments, the passivation layer BP may be omitted.

Figure 7:
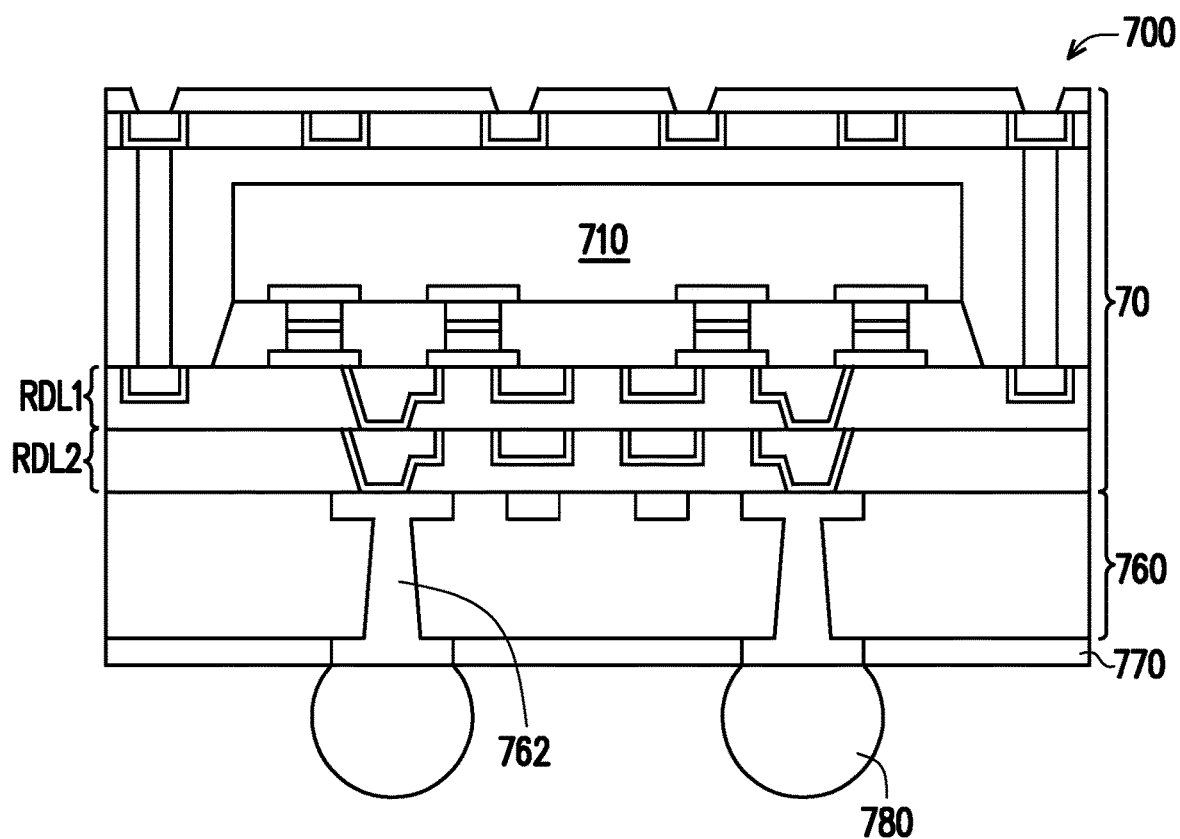
FIG. 7 schematically illustrates a semiconductor package having redistribution layers in accordance with some embodiments.

Referring to FIG. 7, in some embodiments, the package 700 includes a sub-package 70 mounted on a circuit board laminate 760. The sub-package 70 is similar to the package 600 as described in FIG. 6 but without the conductive elements. In some embodiments, the sub-package 70 has the first redistribution layer RDL1 and the second redistribution layer RDL2. In some embodiments, the second redistribution layer RDL2 is physically and electrically connected with the conductive plugs 762 embedded within the circuit board laminate 760. In addition, conductive elements 780 are disposed below circuit board laminate 760 and are connected with the conductive plug 762. In some embodiments, the circuit board laminate 760 is a printed circuit board, and the conductive elements 780 are ball grid array (BGA) balls. In some embodiments, both or at least one of the first and second redistribution layers RDL1, RDL2 may be formed following the processes as described in FIGS. 1A-1F. In some embodiments, at most one of the first and second redistribution layers RDL1, RDL2 is formed following the processes as described in FIGS. 3A-3D. In FIG. 7, in some embodiments, the dual damascene redistribution patterns of the second redistribution layer RDL2 are correspondingly stacked and disposed right above the dual damascene redistribution patterns of the first redistribution layer RDL1.

Figure 8:
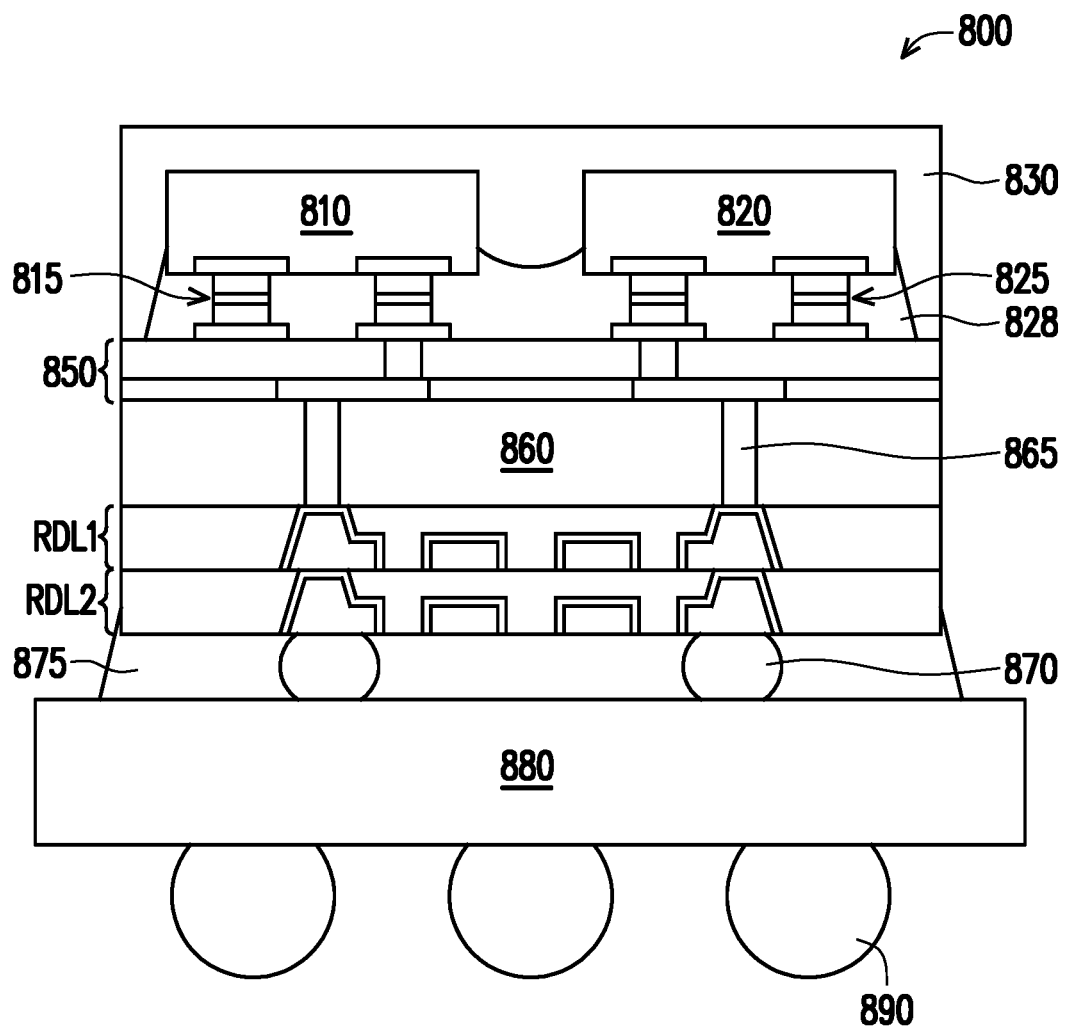
FIG. 8 schematically illustrates a semiconductor package having redistribution layers in accordance with some embodiments.

FIG. 8 schematically illustrates a semiconductor package having redistribution layers in accordance with some embodiments. Referring to FIG. 8, the package 800 includes a circuit substrate 880, an interposer 860, and a first die 810 and a second die 820 encapsulated within a molding compound 830. In some embodiments, the encapsulated first die 810 and the second die 820 are located on an interposer 860 and an interconnecting structure 850 is located between the molding compound 830 and the interposer 860. In some embodiments, the package 800 includes a first redistribution layer RDL1 and a second redistribution layer RDL2 located on the lower side of the interposer 860, and bumps 870 connected with the second redistribution layer RDL2 and located between the circuit substrate 880 and the second redistribution layer RDL2. The first die 810 and the second die 820 are electrically connected with the interconnecting structure 850 through bumps 815 and 825 located there-between. In certain embodiments, the interposer 860 includes through interposer vias 865 penetrating through the interposer 860. In certain embodiments, the first die 810 and the second die 820 are electrically connected with the first and second redistribution layer RDL1, RDL2 through bumps 815/825, the interconnecting structure 850 and the through interposer vias 865 located there-between. In addition, conductive balls 890 are further connected onto the circuit substrate 880.

In some embodiments, both or at least one of the first and second redistribution layers RDL1, RDL2 in FIG. 8 may be formed following the processes as described in FIGS. 1A-1F. In some embodiments, the dual damascene redistribution patterns of the first redistribution layer RDL1 are correspondingly stacked and disposed right above the dual damascene redistribution patterns of the second redistribution layer RDL2. In certain embodiments, some of the dual damascene redistribution patterns of the first redistribution layer RDL1 are directly connected with the through interposer via 865. In certain embodiments, the first die 810 includes a system-on-a-chip (SoC) die or an application specific integrated circuit (ASIC) chip. In certain embodiments, the second die 820 includes a memory chip or a high bandwidth memory chip. In some embodiments, the conductive elements 870 are bumps or controlled collapse chip connection (C4) bumps. In some embodiments, the circuit substrate 880 is an organic flexible substrate or a printed circuit board, while the conductive balls 890 are ball grid array (BGA) balls. In certain embodiments, the package 800 may be formed by chip on wafer on substrate (CoWoS) packaging processes.

Figure 9:
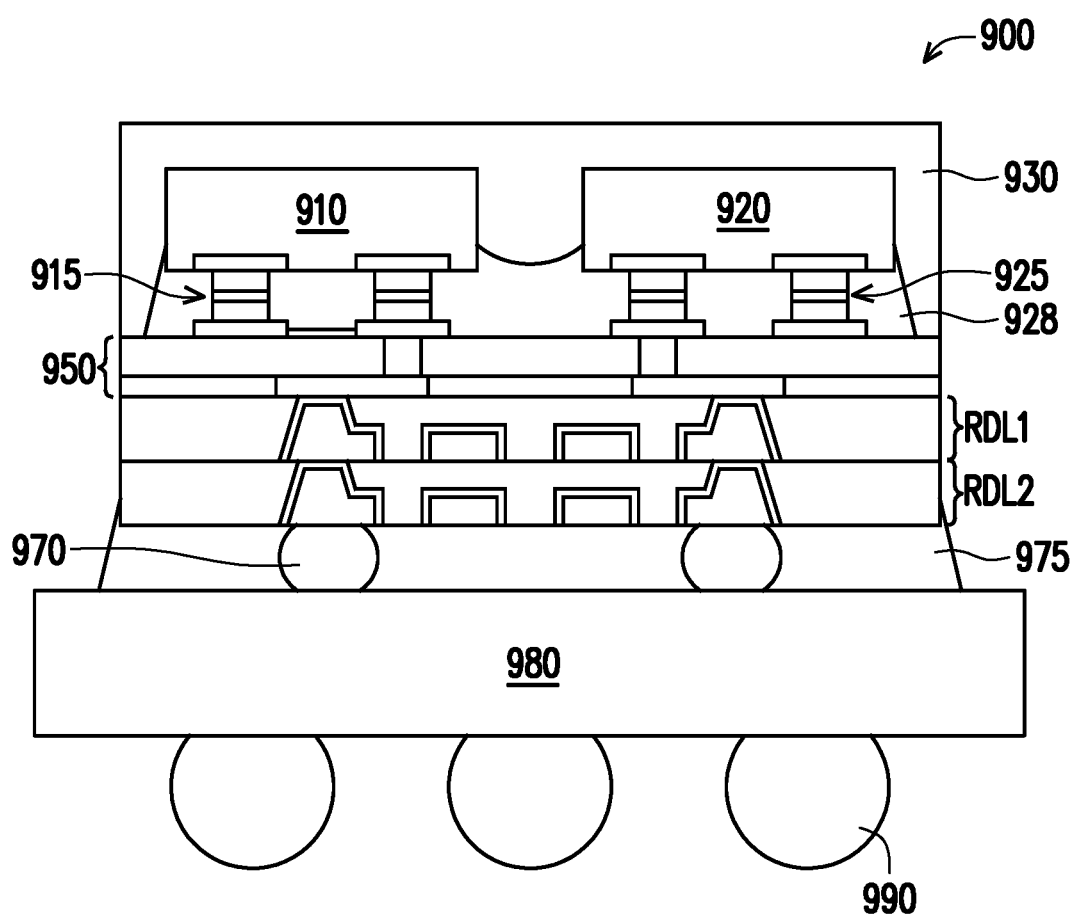
FIG. 9 schematically illustrates a semiconductor package having redistribution layers in accordance with some embodiments.

Referring to FIG. 9, in some embodiments, the package 900 is similar to the package 800 as described in FIG. 8 having the interconnecting structure 950 but without the interposer 860 and through interposer via 865. In some embodiments, the package 900 has the first redistribution layer RDL1 and the second redistribution layer RDL2. Similarly, both or at least one of the first and second redistribution layers RDL1, RDL2 may be formed following the processes as described in FIGS. 1A-1F. In some embodiments, the dual damascene redistribution patterns of the first redistribution layer RDL1 are correspondingly stacked and disposed right above the dual damascene redistribution patterns of the second redistribution layer RDL2.

The redistribution layers as demonstrated and described in the above embodiments are applicable for various types of packages and the layout and design of the redistribution layer may be modified based on the electrical requirements of the products.

In accordance with some embodiments of the present disclosure, a semiconductor package is disclosed. The package includes a first die, a first redistribution layer and a second redistribution layer. The first redistribution layer is disposed over the first die and electrically connected with the first die. The first redistribution layer includes a first dual damascene redistribution pattern and a first seed metallic pattern. The first dual damascene redistribution pattern includes a first via portion and a first routing portion located directly on the first via portion. The first seed metallic pattern covers sidewalls of the first routing portion and covers sidewalls and a bottom surface of the first via portion. The second redistribution layer is disposed on the first redistribution layer and over the first die and electrically connected with the first redistribution layer and the first die. The second redistribution layer includes a second dual damascene redistribution pattern and a second seed metallic pattern. The second dual damascene redistribution pattern includes a second via portion and a second routing portion located directly on the second via portion. The second seed metallic pattern covers sidewalls of the second routing portion and covers sidewalls and a bottom surface of the second via portion. A location of the second via portion is aligned with a location of first via portion.

In accordance with some embodiments of the present disclosure, a semiconductor package includes at least one die, a first redistribution layer, a second redistribution layer and a third redistribution layer. The first redistribution layer is disposed over the at least one die and electrically connected with the at least one die. The first redistribution layer includes a first dual damascene redistribution pattern and a first seed metallic pattern, and the first dual damascene redistribution pattern includes a first via portion and a first routing portion located directly on the first via portion. The first seed metallic pattern covers sidewalls of the first routing portion and covers sidewalls and a bottom surface of the first via portion. The second redistribution layer is disposed on the first redistribution layer and over the at least one die and electrically connected with the first redistribution layer and the at least one die. The second redistribution layer includes a second dual damascene redistribution pattern and a second seed metallic pattern, and the second dual damascene redistribution pattern includes a second via portion and a second routing portion located directly on the second via portion. The second seed metallic pattern covers sidewalls of the second routing portion and covers sidewalls and a bottom surface of the second via portion. The third redistribution layer is disposed on the second redistribution layer and over the at least one die and electrically connected with the first and second redistribution layers and the at least one die. The third redistribution layer includes a third dual damascene redistribution pattern and a third seed metallic pattern, and the third dual damascene redistribution pattern includes a third via portion and a third routing portion. The third seed metallic pattern covers a bottom surface of the third routing portion and covers sidewalls and a bottom surface of the third via portion. The first via portion, the second via portion and the third via portion are vertically stacked over one another and vertically aligned with one another.

In accordance with alternative embodiments of the present disclosure, a method of fabricating a semiconductor package includes at least the following steps. A substrate is provided. A first dielectric layer having first via openings is formed over the substrate. A second dielectric layer having first trench openings is formed on the first dielectric layer. At least one first trench opening is joined with the via opening to form a first dual damascene opening in the first and second dielectric layers. A first seed metallic layer is formed over the second dielectric layer and covers the first dual damascene opening. A first metal layer is formed on the first seed metallic layer filling up the first dual damascene opening. A first redistribution layer having a first dual damascene redistribution pattern in the first dual damascene opening is formed. A third dielectric layer having second via openings is formed on the second dielectric layer. Locations of the second via openings are correspondingly aligned with locations of the first via openings. A fourth dielectric layer having second trench openings is formed on the third dielectric layer. At least one second trench opening is joined with the second via opening to form a second dual damascene opening in the third and fourth dielectric layers. A second seed metallic layer is formed over the fourth dielectric layer and covers the second dual damascene opening. A second metal layer is formed on the second seed metallic layer filling up the second dual damascene opening. A second redistribution layer having a second dual damascene redistribution pattern in the second dual damascene opening is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor die having an active surface;
   through interlayer vias, located beside the semiconductor die and outside from the semiconductor die;
   a first dual damascene redistribution pattern, disposed over the semiconductor die and electrically connected with the semiconductor die, wherein the first dual damascene redistribution pattern includes a first via portion and a first routing portion located on the first via portion; and
   a second dual damascene redistribution pattern, stacked on the first dual damascene redistribution pattern and over the semiconductor die and electrically connected with the semiconductor die, wherein the second dual damascene redistribution pattern includes a second via portion and a second routing portion located on the second via portion,
   wherein the second routing portion is disposed directly on the first via portion, orthogonal projections of the first via portion and the second via portion overlap with each other in a concentric way from a top view, and the first and second routing portions are located closer to the active surface of the semiconductor die than the respective first and second via portions.

2. The package according to claim 1, further comprising a molding compound laterally wrapping the semiconductor die and the through interlayer vias, wherein the molding compound has a thickness measuring from a first side to a second side opposite to the first side, and the through interlayer vias extending from the first side to the second side of the molding compound have a length substantially equivalent to the thickness of the molding compound.

3. The package according to claim 2, wherein the first and second dual damascene redistribution patterns are located at the first side of the molding compound.

4. The package according to claim 3, further comprising a backside redistribution structure located at the second side of the molding compound, wherein the through interlayer vias are connected with the backside redistribution structure.

5. The package according to claim 1, wherein a location of the second via portion is aligned with a location of first via portion.

6. The package according to claim 1, wherein a bottom size of the first via portion is larger than a bottom size of the second via portion.

7. The package according to claim 1, further comprising a circuit board laminate located on and connected with the second dual damascene redistribution pattern.

8. The package according to claim 1, further comprising bumps located between the active surface of the semiconductor die and the first dual damascene redistribution pattern.

9. A semiconductor package, comprising:
at least one semiconductor die encapsulated by a molding compound;
an interposer, disposed over the at least one semiconductor die, wherein the interposer includes at least one through interposer via;
a first dual damascene redistribution pattern, disposed on the interposer, over the at least one semiconductor die and electrically connected with the at least one semiconductor die, wherein the first dual damascene redistribution pattern includes a first via portion and a first routing portion located on the first via portion; and
a second dual damascene redistribution pattern, disposed on the first dual damascene redistribution pattern and electrically connected with the first dual damascene redistribution pattern and the at least one semiconductor die, wherein the second dual damascene redistribution pattern includes a second via portion and a second routing portion located on the second via portion,
wherein the first via portion, the second via portion and the at least one through interposer via vertically stacked over one another and vertically aligned with one another, and orthogonal projections of the first via portion and the second via portion on a horizontal plane overlap with each other in a concentric way.

10. The package of claim 9, wherein the interposer has a thickness measuring from a first side to a second side opposite to the first side, and the at least one through interposer via extending from the first side to the second side of the interposer has a length substantially equivalent to the thickness of the interposer.

11. The package of claim 9, wherein an orthogonal projection of the at least one through interposer via overlaps with the orthogonal projection of the second via portion.

12. The package according to claim 9, wherein a bottom size of the first via portion is substantially equivalent to a bottom size of the second via portion.

13. The package according to claim 9, further comprising an interconnecting structure located between the interposer and the at least one semiconductor die, and the at least one semiconductor die is flip-chip bonded to the interconnecting structure.

14. The package according to claim 13, wherein the interposer is sandwiched between the second dual damascene redistribution pattern and the interconnecting structure.

15. A method of forming a semiconductor package, comprising:
providing a carrier;
forming first via openings in a first dielectric layer over the carrier;
forming first trench openings in a second dielectric layer exposing portions of the first dielectric layer, wherein the first trench openings are connected with the first via openings to form first dual damascene openings in the first and second dielectric layers;
forming a first dual damascene redistribution pattern filling up the first dual damascene openings;
forming second via openings in a third dielectric layer disposed on the second dielectric layer, wherein locations of the second via openings are correspondingly aligned with locations of the first via openings;
forming second trench openings in a fourth dielectric layer exposing portions of the third dielectric layer, wherein the second trench openings are connected with the second via openings to form second dual damascene openings in the third and fourth dielectric layers;
forming a second dual damascene redistribution pattern filling up the second dual damascene openings;
disposing at least one semiconductor die on the second dual damascene redistribution pattern; and
encapsulating the at least one semiconductor die in a molding compound.

16. The method as claimed in claim 15, wherein forming a first dual damascene redistribution pattern filling up the first dual damascene openings comprises:
forming a first seed metallic layer conformally covering the first dual damascene openings;
forming a first metal layer on the first seed metallic layer filling up the first dual damascene openings; and
performing a first planarization process to remove the first metal layer and the first seed metallic layer outside the first dual damascene openings to form a first seed metallic pattern sandwiched between the first dual damascene openings and the first dual damascene redistribution pattern filled up the first dual damascene openings.

17. The method as claimed in claim 16, wherein forming a second dual damascene redistribution pattern filling up the second dual damascene openings comprises:
forming a second seed metallic layer conformally covering the second dual damascene openings;
forming a second metal layer on the second seed metallic layer filling up the second dual damascene openings; and
performing a second planarization process to remove the second metal layer and the second seed metallic layer outside the second dual damascene openings to form a second seed metallic pattern sandwiched between the second dual damascene openings and the second dual damascene redistribution pattern filled up the second dual damascene openings.

18. The method as claimed in claim 15, further comprising forming through interlayer vias before encapsulating the at least one semiconductor die, wherein the through interlayer vias and the at least one semiconductor die are electrically connected with the first and second dual damascene redistribution patterns.

19. The method as claimed in claim 15, further comprising disposing conductive elements on the second dual damascene redistribution pattern opposite to the at least one semiconductor die.

20. The method as claimed in claim 15, further comprising forming backside redistribution structure over the at least one semiconductor die.

* * * * *